US006302927B1

(12) United States Patent
Tanigawa

(10) Patent No.: US 6,302,927 B1
(45) Date of Patent: Oct. 16, 2001

(54) METHOD AND APPARATUS FOR WAFER PROCESSING

(75) Inventor: Osamu Tanigawa, Nagoya (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/600,704

(22) PCT Filed: Jan. 21, 1999

(86) PCT No.: PCT/JP99/00216

§ 371 Date: Jul. 21, 2000

§ 102(e) Date: Jul. 21, 2000

(87) PCT Pub. No.: WO99/38206

PCT Pub. Date: Jul. 29, 1999

(30) Foreign Application Priority Data

Jan. 23, 1998 (JP) .................................. 10/026588

(51) Int. Cl.$^7$ .......................... H01L 21/00; H01L 21/64; B65G 25/00; B65G 21/02
(52) U.S. Cl. ..................... 29/25.01; 414/217; 414/411
(58) Field of Search ................... 29/25.01; 414/411, 414/217

(56) References Cited

U.S. PATENT DOCUMENTS 5,332,013 * 7/1994 Sugita et al. ........................ 141/98
5,772,386 * 6/1998 Mages et al. ...................... 414/411

FOREIGN PATENT DOCUMENTS

| 4-184958 | 7/1992 | (JP) . |
| 4-294766 | 10/1992 | (JP) . |
| 5-310323 | 11/1993 | (JP) . |
| 6-32376 | 2/1994 | (JP) . |
| 7-66273 | 3/1995 | (JP) . |
| 8-191100 | 2/1996 | (JP) . |
| 8-279546 | 10/1996 | (JP) . |

OTHER PUBLICATIONS

Notification of Transmittal of Copies of Translation of the International Preliminary Examination Report (PCT/IB/338) Date Unavail.
International Preliminary Examination Report (PCT/IPEA/409) Date Unavail.

* cited by examiner

Primary Examiner—John F. Niebling
Assistant Examiner—Viktor Simkovic
(74) Attorney, Agent, or Firm—Smith, Gambrell & Russell, LLP

(57) ABSTRACT

A wafer treatment apparatus is divided into a working zone (S1) and a loading zone (S2) by a wall (2). A closed wafer cassette(3) has a cassette body 31 having a bottom wall provided with a normally closed valve (5). A vent pipe (51) has one end part projecting from a cassette table (6) disposed in the working zone (S1) and the other end part opening into the loading zone (S2). When the cassette (3) is placed on the cassette table (6), the vent pipe (51) wedges through an incision formed in the valve (5) into the wafer cassette (3) to enable the interior of the cassette (3) to communicate with the loading zone (S2). Consequently, the pressure difference between the interior of the cassette (3) and the loading zone (S2) is reduced to naught.

6 Claims, 9 Drawing Sheets

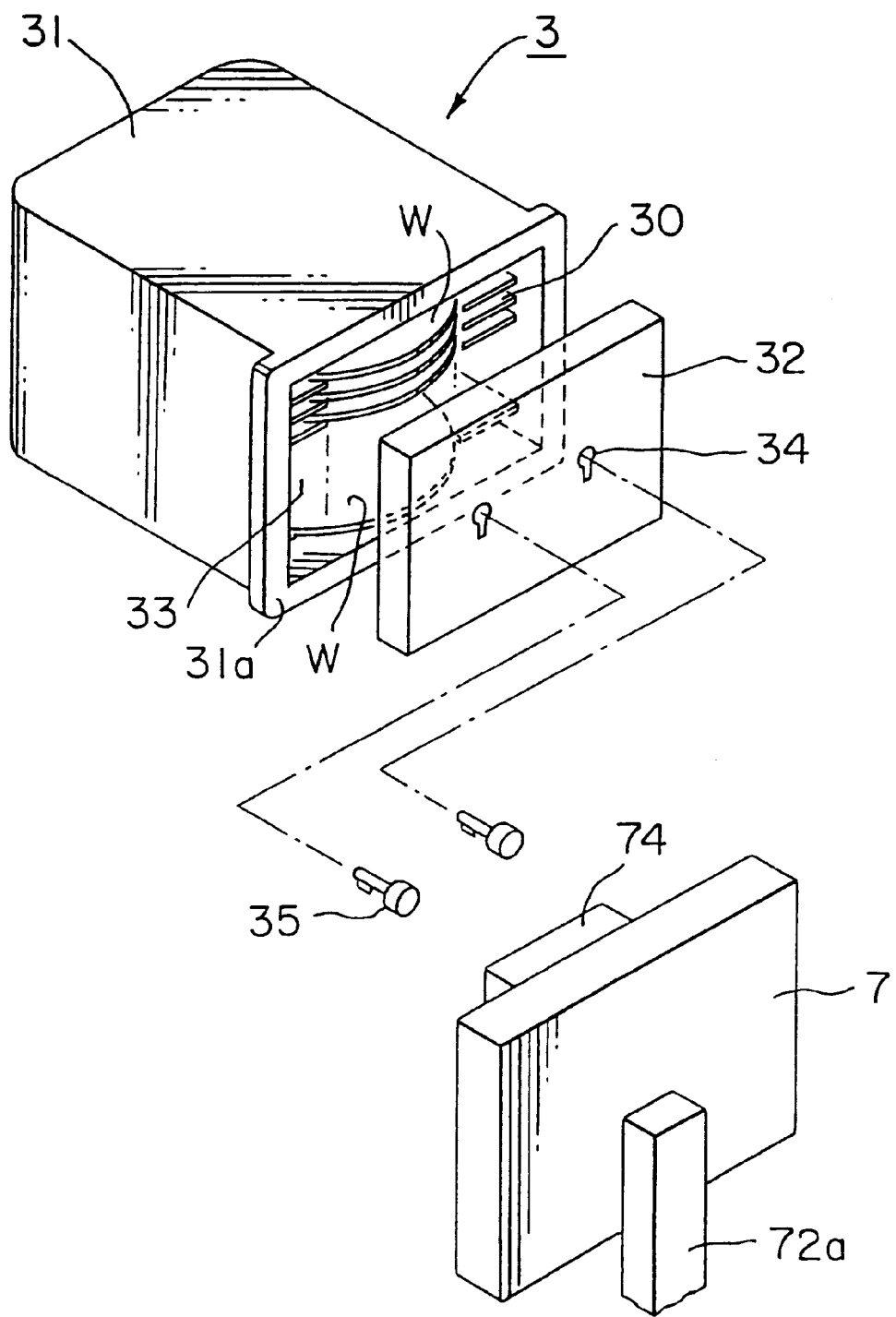
F I G. 2

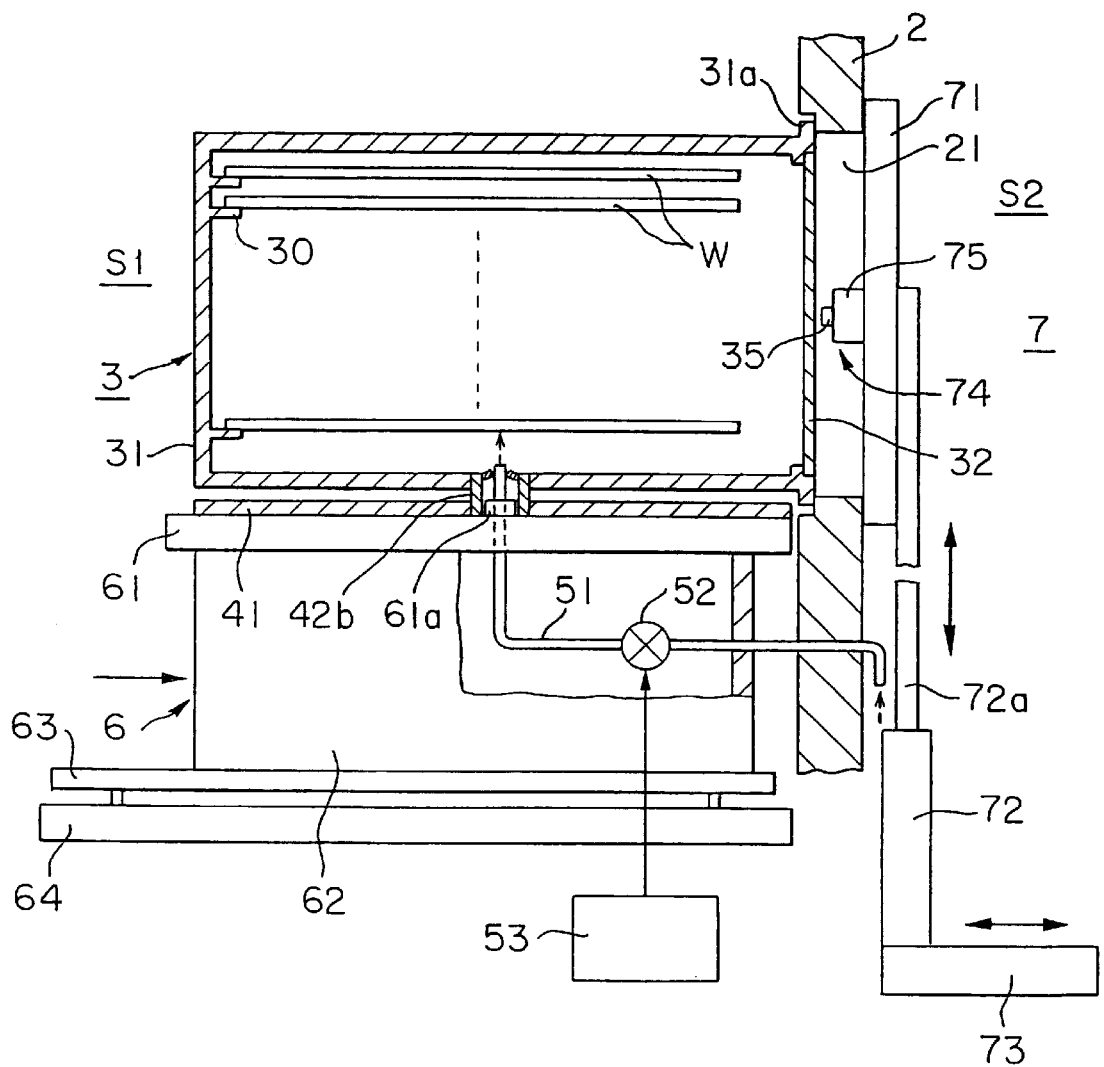
F I G. 3

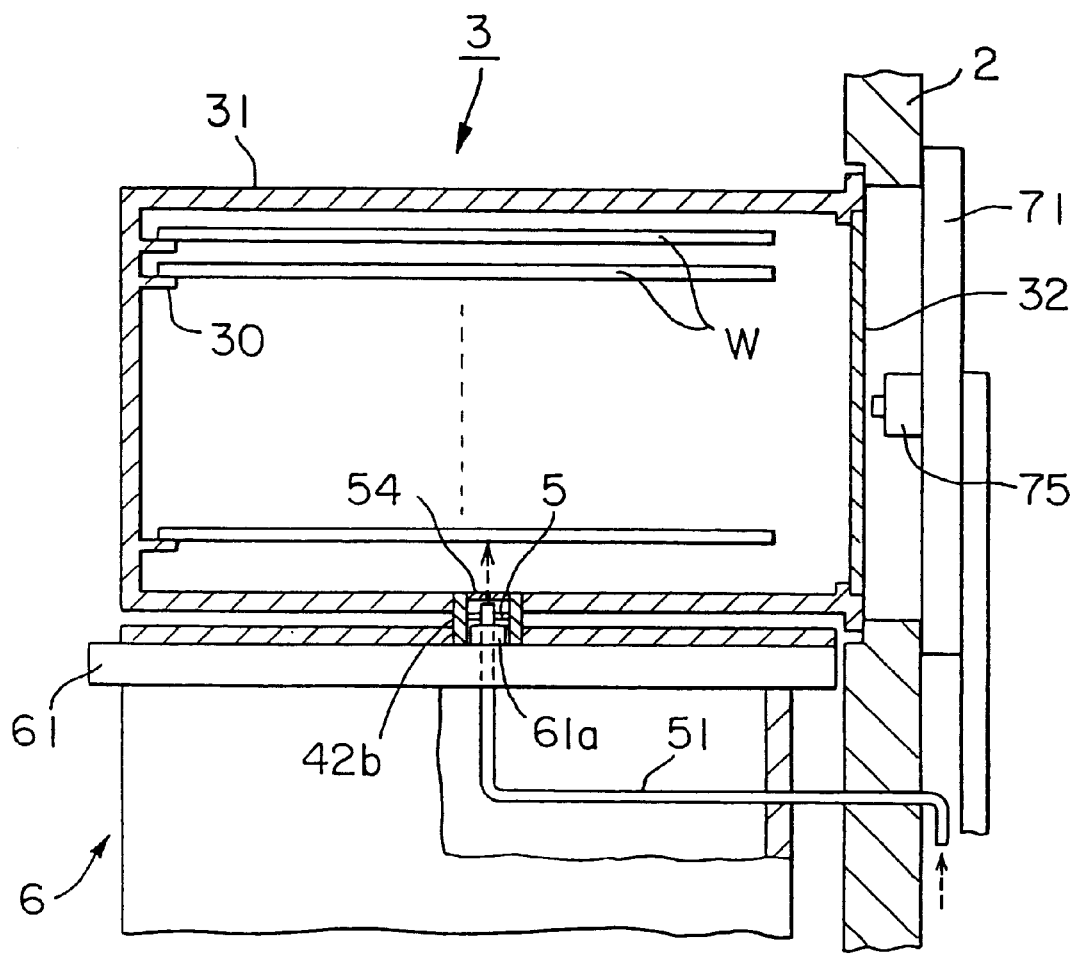
F I G. 7

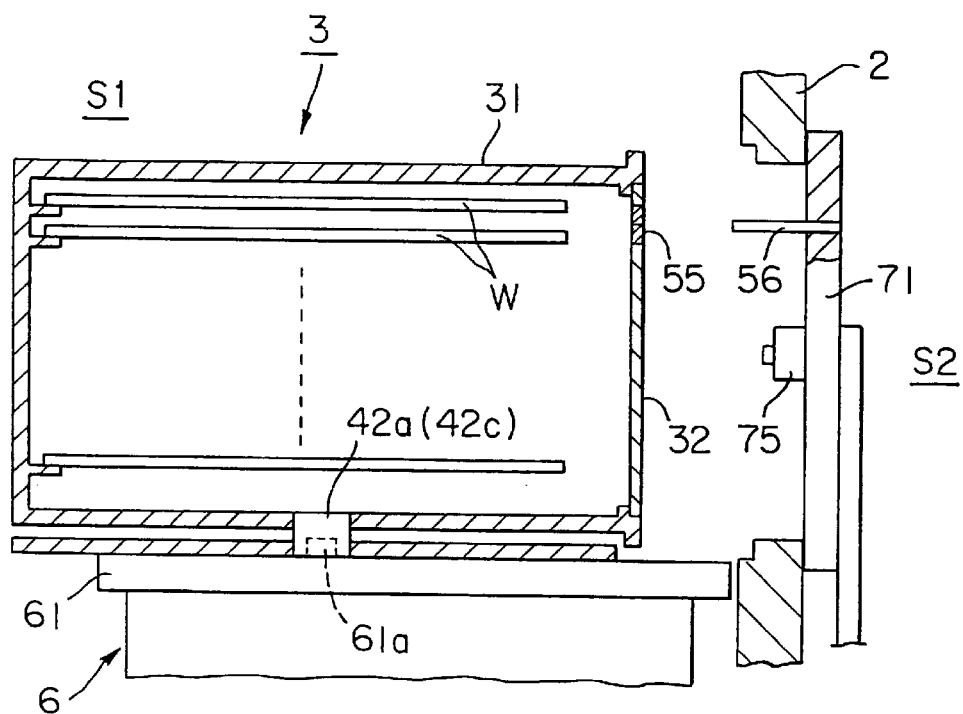
F I G. 8(a)
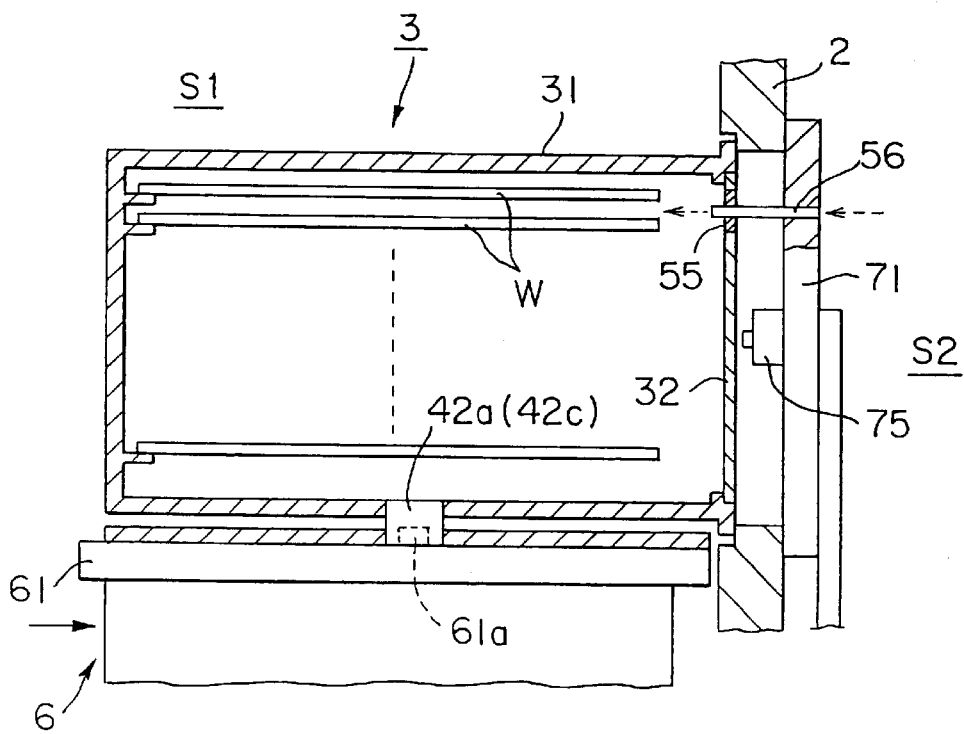
F I G. 8(b)

METHOD AND APPARATUS FOR WAFER PROCESSING

TECHNICAL FIELD

The present invention relates to a wafer treatment apparatus and a wafer treatment method.

BACKGROUND ART

Efforts have been made to develop a closed wafer cassette (hereinafter referred to simply as "closed cassette") intended to avoid the contamination of semiconductor wafers (hereinafter referred to simply as "wafers") with particles (Monthly Semiconductor World, January, 1997). As shown in FIG. 10, this closed cassette 1 has a cassette body 10 for containing, for example, thirteen wafers W, and a lid 11 capable of hermetically closing an opening formed in one side of the cassette body 10. The lid 11 can be fastened to the cassette body 10 by means of a key, not shown.

A method of using this closed cassette 1 will be described as used in combination with a heat treatment apparatus. A working zone S1 in which the closed cassette 1 is carried by an operator or a carrying robot, and a loading zone S2 of a cleanliness higher than that of the working zone S1 are separated from each other by a wall 13. The closed cassette 1 is joined to a surface of the wall 13 on the side of the working zone S1 so as to correspond to a gateway 14 formed in the wall 13. In FIG. 10, indicated at 15 is a cassette table. Normally, the gateway 14 is closed by a door 16. The lid 11 is opened by an opening device 17 built on the door 16.

After removing the lid 11 from the cassette body 10, the lid 11 is carried into the loading zone S2 together with the door 16 by a door operating mechanism 18 which moves the door 16 vertically and horizontally. Then, the wafers W are taken out of the cassette 1 by a transfer mechanism, not shown, disposed in the loading zone S2.

In the loading zone S2, the wafers W are transferred to a wafer boat, not shown, and the wafer boat carrying the wafers W are carried into a thermal treatment furnace to subject the wafers W to a predetermined thermal process. The wafers W processed by the thermal process are returned into the closed cassette 1, the closed cassette 1 is conveyed to the next processing station, such as a cleaning station. Then, the lid 11 is removed, the wafers W are taken out of the cassette 1 and are subjected to a cleaning process.

In this thermal treatment apparatus, the loading zone S2 is kept at a positive pressure higher than that in the working zone S1 so that clean air flows from the loading zone S2 into the working zone S1 to prevent particles from entering the loading zone S2. The positive pressure in the loading zone S2 is higher than the atmospheric pressure by, for example, 1 Pa or above, preferably, by about 500 Pa.

The interior of the closed cassette 1 is purged by clean air or nitrogen ($N_2$) gas. The pressure in the cassette 1 is approximately equal to 1 atm, the atmospheric pressure. Since the pressure in the closed cassette 1 is slightly lower than that in the loading zone S2, the lid 11 is difficult to open when an effort is made to open the lid 11 after joining the closed cassette 1 to the wall 13 with the opening of the closed cassette 1 coincided with the gateway 14, and large power is necessary to drive the door operating mechanism 18 for removing the lid 11 from the cassette body 10.

The temperature of the wafers W immediately after the completion of the thermal process is, for example, on the order of 100° C. If the wafers W heated at about 100° C. are put in the closed cassette 1 and the wafers W are cooled to a room temperature, the pressure in the closed cassette 1 drops to a pressure slightly below the atmospheric pressure. Accordingly, large power is necessary for removing the lid 11 from the cassette body 10 when opening the cooled closed cassette 1 at the cleaning station to take out the wafers W from the closed cassette 1 because the cleaning station is kept at the atmospheric pressure.

If the pressure in the closed cassette 1 is lower than the pressure in an atmosphere in which the closed cassette 1 is to be opened, the gas prevailing in the atmosphere will blow suddenly into the cassette 1 upon the removal of the lid 11 from the cassette body 10, blowing up particles.

DISCLOSURE OF THE INVENTION

The present invention has been made in view of those problems and it is therefore an object of the present invention to provide a wafer treatment apparatus capable of easily removing a lid from the cassette body of an closed cassette by reducing to naught the pressure difference between the interior of the closed cassette and a clean atmosphere in which the closed cassette is to be opened, and a wafer treatment method to be carried out by the wafer treatment apparatus.

According to a first aspect of the present invention, a wafer treatment apparatus comprises: a wafer cassette having a cassette body provided with an opening in one side thereof for accommodating a wafer, and a lid capable of hermetically closing the opening of the cassette body; a cassette table for supporting the wafer cassette thereon, disposed in a working environment separated from a clean environment by a wall; a normally closed valve disposed at a through hole formed in the cassette body or the lid; and a vent pipe capable of being inserted through the valve to allow the interior of the wafer cassette to communicate with the clean atmosphere.

According to the present invention, the wall may be provided with a gateway at a position corresponding to the wafer cassette as mounted on the cassette table, and the gateway of the wall may be closed by a door.

According to the present invention, the through hole may be formed in a bottom wall of the cassette body, the valve may be placed at the through hole, and the vent pipe may have one end part projecting upward from the cassette table.

According to the present invention, the through hole may be formed in a side wall of the cassette body or the lid, the valve may be placed in the through hole, the vent pipe may have one end part projecting from the wall.

According to the present invention, the vent pipe may be provided with a control valve, the cassette table may be provided with a detector switch for detecting the wafer cassette when the same is placed on the cassette table, and the control valve may be controlled by a controller which controls the control valve on the basis of a signal provided by the detector switch.

According to the present invention, the bottom wall of the cassette body may be provided with a connecting projection surrounding the valve and defining the through hole, the cassette table may be provided with a table projection capable of being mated with the connecting projection, and the vent pipe may have one end part held by the table projection.

According to a second aspect of the present invention, a wafer treatment method comprises the steps of: preparing a wafer cassette having a cassette body provided with an opening in one side thereof for accommodating a wafer, and a lid capable of hermetically closing the opening; placing the wafer cassette on a cassette table disposed in a working atmosphere separated from a clean atmosphere by a wall having a gateway; connecting the interior of the wafer cassette to the clean atmosphere; removing the lid from the cassette body, and taking out the wafer through the opening of the cassette body from the wafer cassette and carrying the wafers into the clean atmosphere through the gateway of the wall.

According to a third aspect of the present invention, a wafer treatment apparatus comprises: a wafer cassette having a cassette body provided with an opening in one side thereof for accommodating a wafer, and a lid capable of hermetically closing the opening of the cassette body; a cassette table for supporting the wafer cassette thereon; a normally closed inlet valve attached to a gas inlet port formed in the cassette body or the lid; a normally closed outlet valve attached to a gas outlet port formed in the cassette body or the lid; a gas supply pipe capable of being inserted through the inlet valve into the wafer cassette when the wafer cassette is placed on the cassette table; a gas exhaust pipe capable of being inserted through the outlet valve into the wafer cassette when the wafer cassette is placed on the cassette table; and an inert gas source connected to the gas supply pipe.

BRIEF DESCRIPTION OF THE DRAWINGS

FIG. 2 is a perspective view of a closed cassette;

FIG. 3 is a sectional view of the closed cassette as joined to a wall;

FIG. 7 is a sectional view of another closed cassette;

FIG. 8(a) is a sectional view of a wafer treatment apparatus in a second embodiment according to the present invention;

FIG. 8(b) is a sectional view of the wafer treatment apparatus in the second embodiment according to the present invention;

BEST MODE FOR CARRYING OUT THE INVENTION

Preferred embodiments of the present invention reduces the pressure difference between the interior of a wafer cassette and a clean atmosphere of a pressure different from that in the interior of the wafer cassette before removing a lid from the wafer cassette in the clean atmosphere by allowing the interior of the cassette to communicate with the clean atmosphere.

Figure 1:
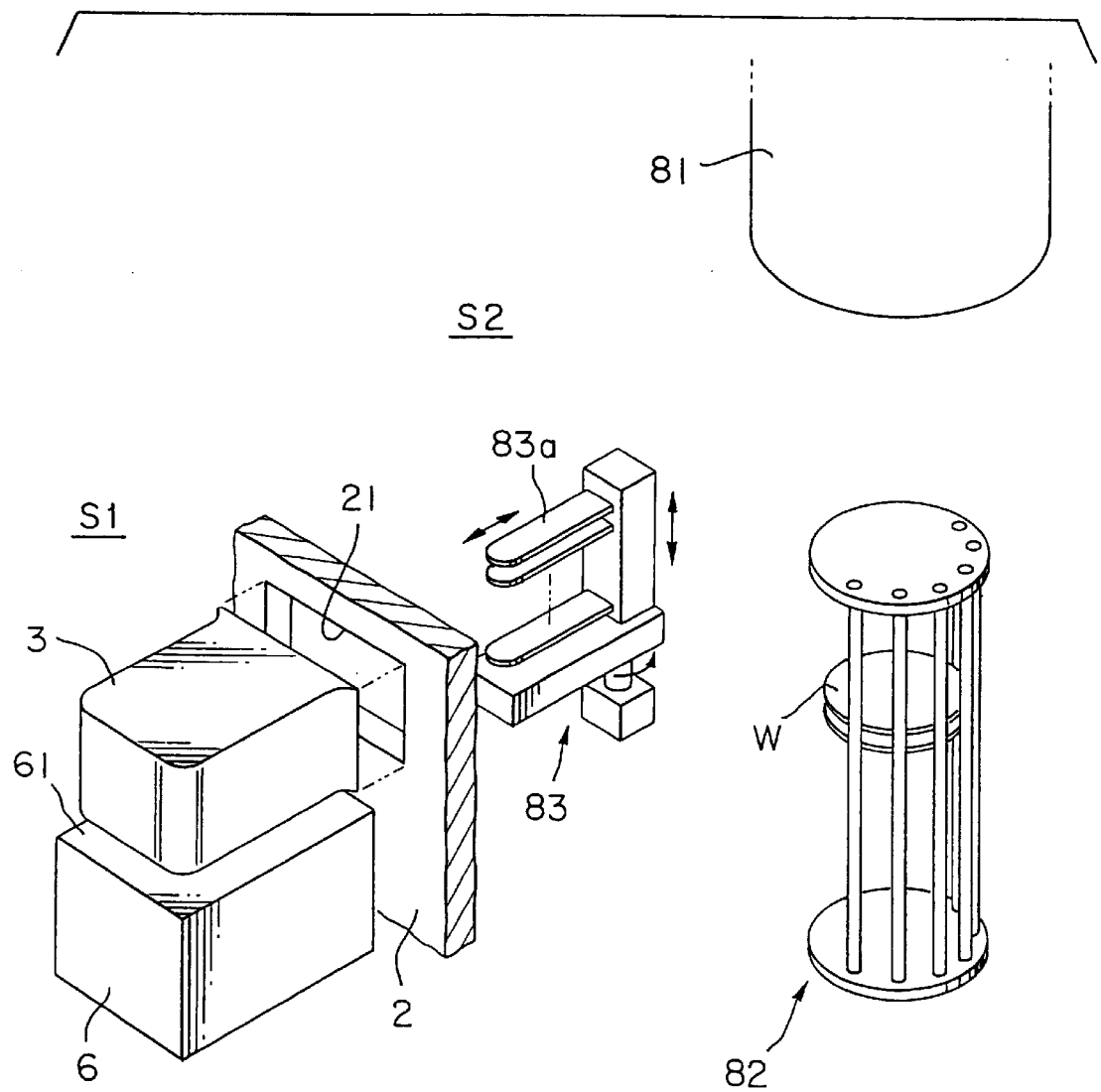
FIG. 1 is a perspective view of a wafer treatment apparatus in a preferred embodiment according to the present invention.

FIG. 1 shows a thermal treatment apparatus as a wafer treatment apparatus in a first embodiment according to the present invention. The thermal treatment apparatus has a working zone S1 and a loading zone S2 separated from each other by a wall 2. Both the working zone S1 and the loading zone S2 are those in a clean room. The loading zone S2 has a cleanliness higher than that of the working zone S1. The term "clean atmosphere" means an atmosphere in the loading zone S2, and the term "working atmosphere" means an atmosphere in the working zone S1. The wall 2 is provided with a gateway 21 through which wafers are transferred. A closed cassette 3 (hereinafter referred to simply as "cassette 3") is closely joined to a surface of the wall 2 on the side of the working zone S1 so as to coincide with the gateway 21.

The cassette 3 will be described with reference to FIGS. 2 to 5. The cassette 3 has a cassette body 31 provided with wafer shelves 30 for accommodating and supporting, for example, thirteen wafers W in a vertical stack and an opening 33 formed in one side thereof, and a lid 32 capable of hermetically covering the opening 33. The lid 32 is fitted in a step formed around the opening 33. The cassette body 31 is provided with a flange 31a surrounding the opening 33.

The lid 32 is provided, for example, with two keyholes 34. The lid 32 is fastened to the cassette body 31 by inserting keys 35 included in a lid operating mechanism, which will be described later, in the keyholes 34 and turning the keys 35 to project locking pins, not shown, from the upper and the lower edge of the lid 32.

Figure 4:
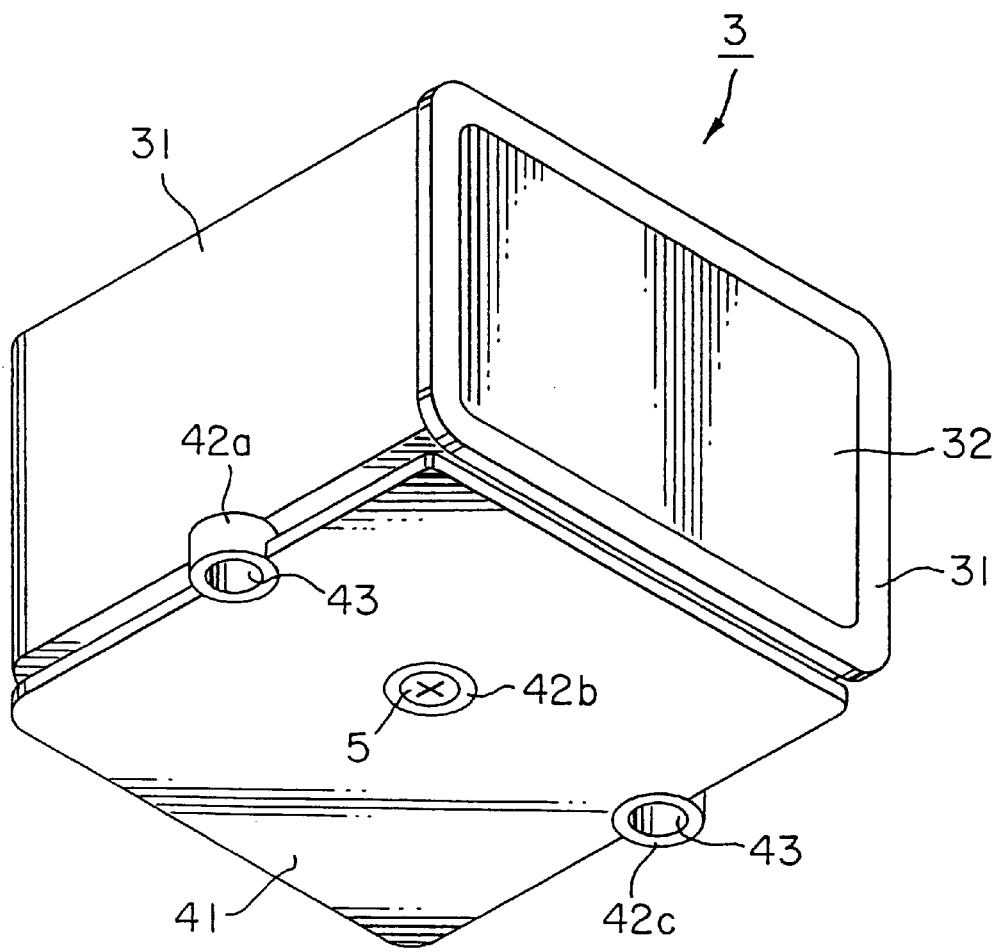
FIG. 4 is a perspective view of the closed cassette.

As shown in FIGS. 3 and 4, a base plate 41 substantially the same in shape as the bottom wall of the cassette body 31 is connected to the bottom wall of the cassette body 31 of the cassette 3. The base plate 41 is spaced from and connected to the cassette body 31 by cylindrical connecting projections 42a to 42c. The connecting projections 42a and 42c are formed at the substantially middle parts of the opposite longitudinal side edges of the bottom wall of the cassette body 31, and the connecting projection 42b is formed in a substantially central part of the bottom wall of the cassette body 31.

Each of the connecting projections 42a and 42c has a closed upper end part, and a lower end part, i.e., an end part on the side of the base plate 41, provided with a recess 43. The connecting projection 42b has an upper end part opening into the cassette body 31 and a lower end part opening outside through the base plate 41. A connecting hole 44 extends through the connecting projection 42b. The inside of the cassette 3 can be connected to the environment surrounding the cassette 3 by the connecting hole 44.

Figure 5:
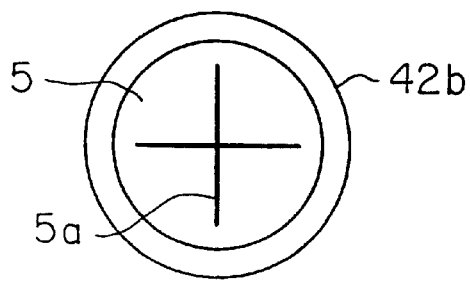
FIG. 5 is a bottom view of a connecting projection of the closed cassette of FIG. 4.

As shown in FIG. 5 in a bottom view, a valve 5 is fitted in, for example, an upper part of the connecting hole 44 of the connecting projection 42b. The valve 5 is an elastic plate, such as a rubber plate, provided with a cruciform incision 5a and has a peripheral part fixed to the inner surface of the connecting projection 42b. Normally, the incision 5a of the valve 5 is closed to keep the interior of the cassette 3 sealed hermetically.

The cassette 3 is placed on a stage 61 included in a cassette table 6 disposed in the working zone S1 with its opening 33 corresponding to the gateway 21. The stage 61 is supported on a stage support 62 capable of moving toward and away from the wall 2 along guide rails 63 laid on a base 64.

The stage 61 is provided on its upper surface with, for example, three table projections 61a at positions respectively corresponding to the recesses 43 of the connecting projections 42a and 42c and the connecting hole 44 of the connecting projection 42b. The table projections 61a are fitted in the recesses 43 and the connecting hole 44 of the cassette 3 to position the cassette 3 on the stage 61. The valve 5 is positioned in the connecting projection 42b so that the table projection 61a may not interfere with the valve 5 when the cassette 3 is set in place on the stage 61.

A vent pipe 51 of an outside diameter smaller than the inside diameter of the connecting projection 42b is extended through the table projection 61a corresponding to the connecting projection 42b among the three projections 61a so as to project from the upper end of the projection 61a. The vent pipe 51 has one end part which projects through the cruciform incision 5a of the valve 5 into the interior of the cassette 3 when the cassette 3 is put in place on the stage 61, and the other end part extended through and projecting from the wall 2 into the loading zone S2. The vent pipe 51 is extended so that the opposite end parts thereof may not be dislocated from the set positions even if the stage support 62 is moved toward and away from the wall 2.

Normally closed control valve 52 is placed in the vent pipe 51. The control valve 52 is opened gradually by a control signal provided by a control unit 53 when a detector switch 53a is closed by placing the cassette 3 on the cassette table 6. In this embodiment, the vent pipe 51 and the valve 52 constitute a connecting means. Although the wall 2 and the cassette table 6 are shown in FIG. 1 as positioned on the front side of their normal positions for convenience, actually, the wall 2 and the cassette table 6 are at positions nearer to a transfer mechanism, which will be described later.

A door 71 for hermetically closing the gateway 21 of the wall 2 is disposed opposite to a surface of the wall 2 on the side of the loading zone S2. The door 71 is formed in a shape and a size that enable the door 71 to cover the gateway 21 and a part of the wall 2 surrounding the gateway 21. A door operating mechanism 7 has a lifting unit 72 provided with a lifting rod 72a connected to the door 71 and capable of vertically moving the door 71, and a base 73 for horizontally moving the lifting unit 72. A lid handling device 74 for handling the lid 32 of the cassette 3 is combined with the door 71. The lid handling device 74 is provided with a key operating mechanism 75 for horizontally moving and turning the keys 35.

A thermal treatment furnace 81 for processing wafers by a thermal process is installed in the loading zone S2. A wafer boat 82 is disposed below the thermal treatment furnace 81. The wafer boat 82 holding, for example, 150 wafers in a stack is carried into the thermal treatment furnace 81 by a boar elevator. Wafers are transferred between the cassette 3 and the wafer boat 82 by a transfer mechanism 83 provided with five support arms 83a to carry, for example, five wafers at a time. The transfer mechanism 83 is also able to carry one wafer at a time. The support arms 83a can be moved in horizontal directions, and vertical directions and can be turned.

The operation of the wafer treatment apparatus will be described below. The interior of the cassette 3 is purged by nitrogen gas after putting wafers W in the cassette 3. The pressure in the cassette 3 is substantially equal to the atmospheric pressure. The loading zone S2 is purged of air by clean air to prevent the formation of oxide film by natural oxidation and to prevent nitrogen gas from entering the loading zone S2, and is kept at a positive pressure higher than that of the working zone S1 to prevent the entrance of particles into the loading zone S2. The pressure in the loading zone S2 is higher than the atmospheric pressure by 1 Pa or above, preferably, by about 500 Pa.

Figure 6A:
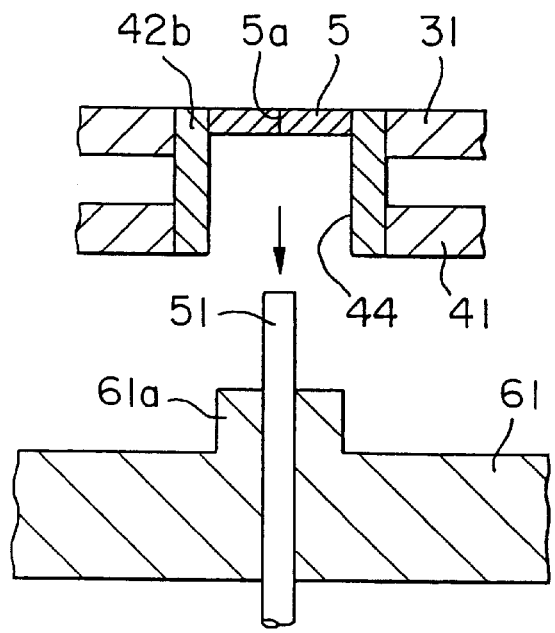
FIG. 6(a) is a sectional view of assistance in explaining the function of a valve.
Figure 6B:
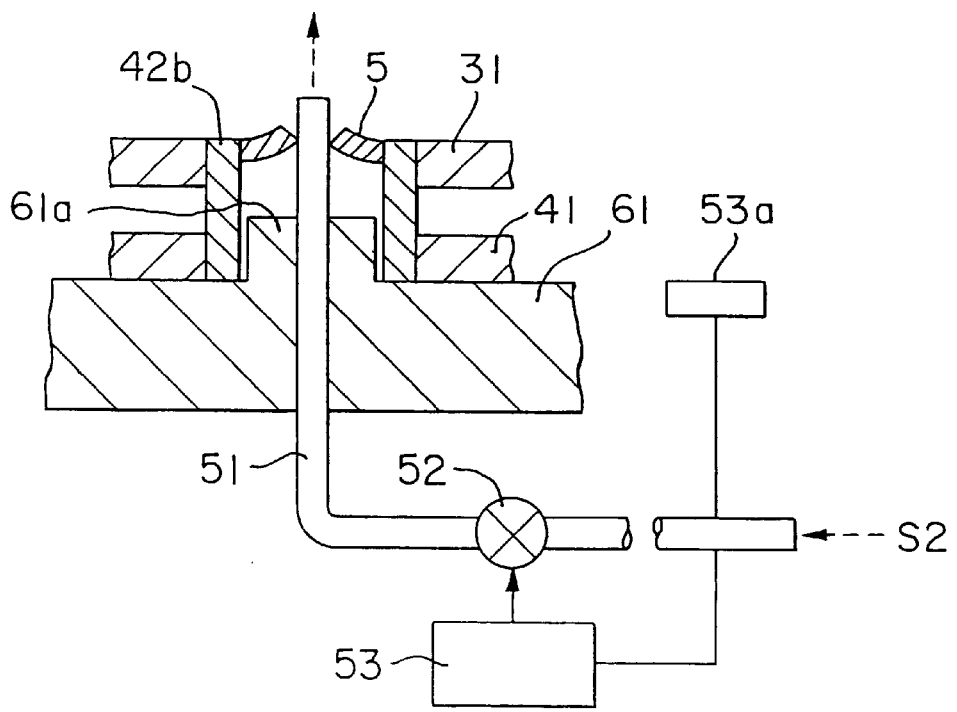
FIG. 6(b) is a sectional view of assistance in explaining the function of a valve.

As shown in FIG. 6(a), the cassette 3 is positioned so that the table projection 61a of the stage 61 of the cassette table 6 is aligned with the connecting hole 44 of the connecting projection 42b, and then the cassette 3 is placed on the stage 61 with the projection 61a fitted in the connecting hole 44 of the connecting projection 42b. In this state, the end part of the vent pipe 51 projecting from the table projection 61a of the stage 61 is forced to wedge through the cruciform incision 5a of the valve 5 into the cassette 3. Then, the stage support 62 is pushed by a pushing mechanism, not shown, against the wall 2 so that the opening 33 of the cassette 3 coincides with the gateway 21.

When the cassette 3 is placed on the cassette table 6, the valve 5 is opened by the vent pipe 51, the end part of the vent pipe 51 projects into the cassette 3, the detecting switch 53a is closed, and the control unit 53 gives a control signal to the control valve 52 to open the control valve 52. Consequently, the interior of the cassette 3 communicates with the loading zone S3 by means of the vent pipe 51, nitrogen gas or clean air flows from the loading zone S2 of a pressure higher than that in the cassette 3 into the cassette 3. The flow of the nitrogen gas or the clean air is controlled by the control valve 52. Thus, the pressure difference between the loading zone S2 and the interior of the cassette 3 decreases gradually and, eventually, the pressures in the loading zone S2 and the interior of the cassette 3 are equalized.

After a predetermined time necessary for equalizing the pressures in the loading zone S2 and the interior of the cassette 3 has ended, the keys 35 of the key operating mechanism 75 of the lid handling device 74 are inserted in the keyholes 34 of the lid 32 of the cassette 3, and the keys 35 are turned to retract the locking pins so that the lid 32 is unlocked. Then, the base 73 of the door operating mechanism 7 is moved away from the wall 2 to remove the door 71 from the wall 2, and then the door 71 is lowered by the lifting unit 72. Consequently, the door 71 is moved away from the doorway 21 and the lid 32 is removed from the cassette body 31.

Subsequently, the support arms 83a of the transfer mechanism 83 are advanced into the cassette 3 to support the five wafers W simultaneously on the support arms 83a, and the wafers W are transferred to the wafer boat 82. After the wafer boat 82 has been loaded with, for example, 150 wafers W, the wafer boat 82 is lifted up by the boat elevator, not shown, into the thermal treatment furnace 81, and the wafers W are subjected to a predetermined thermal process.

Thus, the wafer treatment apparatus makes the interior of the cassette 3 communicate with the loading zone S3 before the lid 32 is removed to reduce the pressure difference between the interior of the cassette 3 and the loading zone S2 to naught. Accordingly, any pressure is not acting on the lid 32 when the lid 32 is removed from the cassette body 31 and hence the lid 32 can easily be removed from the cassette body 31. Therefore, the door operating mechanism 7 can be driven by small power. Since there is no pressure difference between the interior of the cassette 3 and the loading zone S2, gases will not blow suddenly into the cassette 3 upon the removal of the lid 32 from the cassette body 31 and particles will not be blown up.

Since the flow of nitrogen gas or clean air can be controlled so that nitrogen gas or clean air flows at a low flow rate in the initial stage of supplying nitrogen gas or clean air from the loading zone S2 into the cassette 3 and the flow of nitrogen gas or clean air increased gradually. Thus, the sudden flow of nitrogen gas or clean air into the cassette 3 can be suppressed and particles are not blown up.

The table projection 61a surrounding vent pipe 51 and the connecting projection 42b serve in positioning the cassette 3 on the cassette table 6, and the valve 5 can surely be opened by the vent pipe 51 when the cassette 3 is positioned correctly on the cassette table 6. The vent pipe 51 can simply be aligned with the valve 5.

The valve 5 may be positioned in the connecting projection 42b so that the table projection 61a may not interfere with the valve 5 when the cassette 3 is set in place on the stage 61, a filter 54 for trapping particles may be disposed above the valve 5 in the connecting projection 42b, and the length of the end part of the vent pipe 51 projecting from the projection 61a may be determined so that the extremity of the end part of the vent pipe 51 is positioned between the valve 5 and the filter 54 when the cassette 3 is set in place on the stage 61 as shown in FIG. 7 to prevent blowing up particles instead of preventing blowing up particles by using the control valve 52.

A wafer treatment apparatus in a second embodiment according to the present invention will be described below. The wafer treatment apparatus in the second embodiment differs from that in the first embodiment in that a lid 32 included in a cassette 3 is provided with a valve 55, and a vent pipe 56 is held on a door 71 at a position corresponding to the valve 55 on the lid 32 as shown in FIG. 8(a). The vent pipe 56 has a front end part projecting from the door 71 into a working zone S1 perpendicularly to a surface of the door 71 facing the working zone S1, and a rear end part opening into a loading zone S2. The wafer treatment apparatus in the second embodiment is the same in the constitution of the valve 55 and in other respects as that in the first embodiment. The vent pipe 56 may be provided with a control valve 52 and a filter 54.

As shown in FIG. 8(b), when the cassette 3 is joined to a wall 2, the front end part of the vent pipe 56 wedges through an incision 5a formed in the valve 55 into the cassette 3 to open the valve 55. Consequently, the interior of the cassette 3 is allowed to communicate with the atmosphere of the loading zone S2, the pressure in the cassette 3 is equalized with that in the loading zone S2 to prevent troubles as those mentioned above when the lid 32 of the cassette 3 is removed.

Figure 9A:
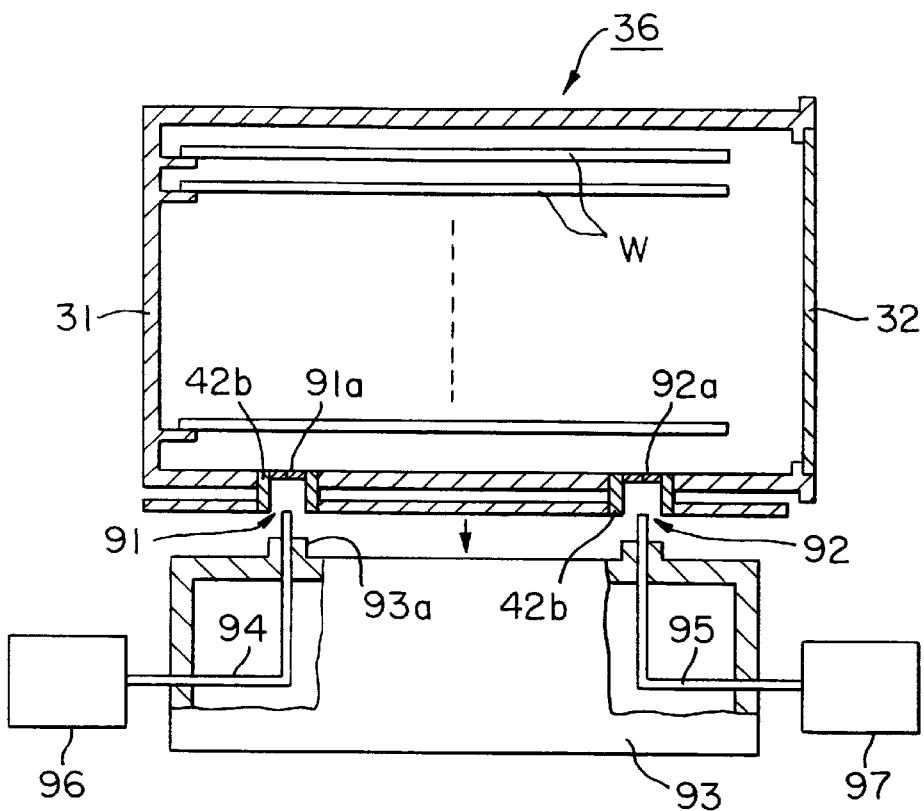
FIG. 9(a) is a sectional view of a wafer carrying mechanism in a third embodiment according to the present invention.

A wafer treatment apparatus in a third embodiment according to the present invention will be described with reference to FIGS. 9(a) and 9(b). A closed cassette 36 (hereinafter referred to simply as "cassette 36") in the third embodiment is provided with a pair of connecting projections 42b similar to the connecting projection 42b of the cassette 3 in the first embodiment. One of the connecting projections 42b has an axial through hole serving as a gas inlet port 91, and the other connecting projection 42b has an axial through hole serving as a gas outlet port 92.

An upper end part of a gas supply pipe 94 (gas supply means) of an outside diameter is smaller than the inside diameter of the connecting projection 42b, and an upper end part of a gas exhaust pipe 95 (gas exhaust means) of an outside diameter is smaller than the inside diameter of the connecting projection 42b. The upper end parts of the gas supply pipe 94 and the gas exhaust pipe 95 project respectively from the upper ends of projections 93a of the upper surface of the upper wall of a purging table 93 at positions respectively corresponding to the connecting projections 42a so as to engage with the connecting projections 42a, respectively, when the cassette 36 is set in place on the purging table 93.

The gas supply pipe 94 is connected to a nitrogen gas source 96, i.e., a purge gas source for supplying a purge gas, such as an inert gas. The gas exhaust pipe 95 is connected to an exhaust means 97. The gas inlet port 91 is provided with an inlet valve 91a, and the gas outlet port 92 is provided with an outlet valve 92a. The valves 91a and 92a are similar in constitution to the valve 5.

When using the cassette 36, wafers Ware put in the cassette 36 in an atmospheric environment. The cassette 36 is placed on the purging table 93 with the upper end parts of the gas supply pipe 94 and the gas exhaust pipe 95 wedging through the inlet vale 91a disposed at the gas inlet port 91, and the outlet valve 92a disposed at the gas outlet port 92, respectively, into the cassette 36.

Figure 9B:
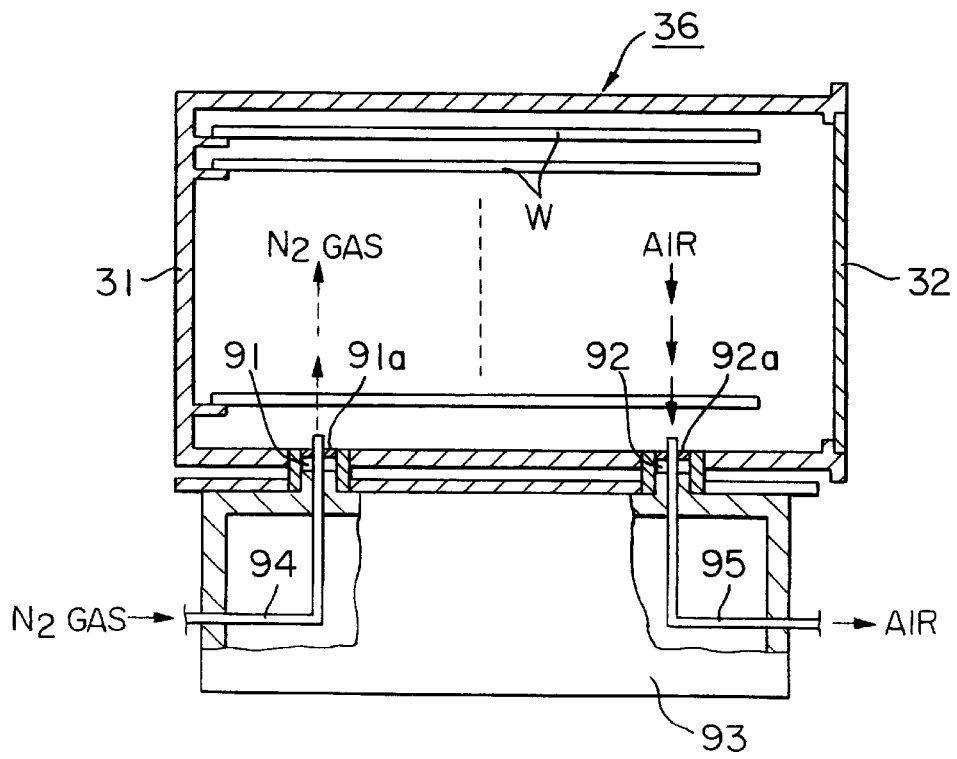
FIG. 9(b) is a sectional view of the wafer carrying mechanism in the third embodiment according to the present invention.
Figure 10:
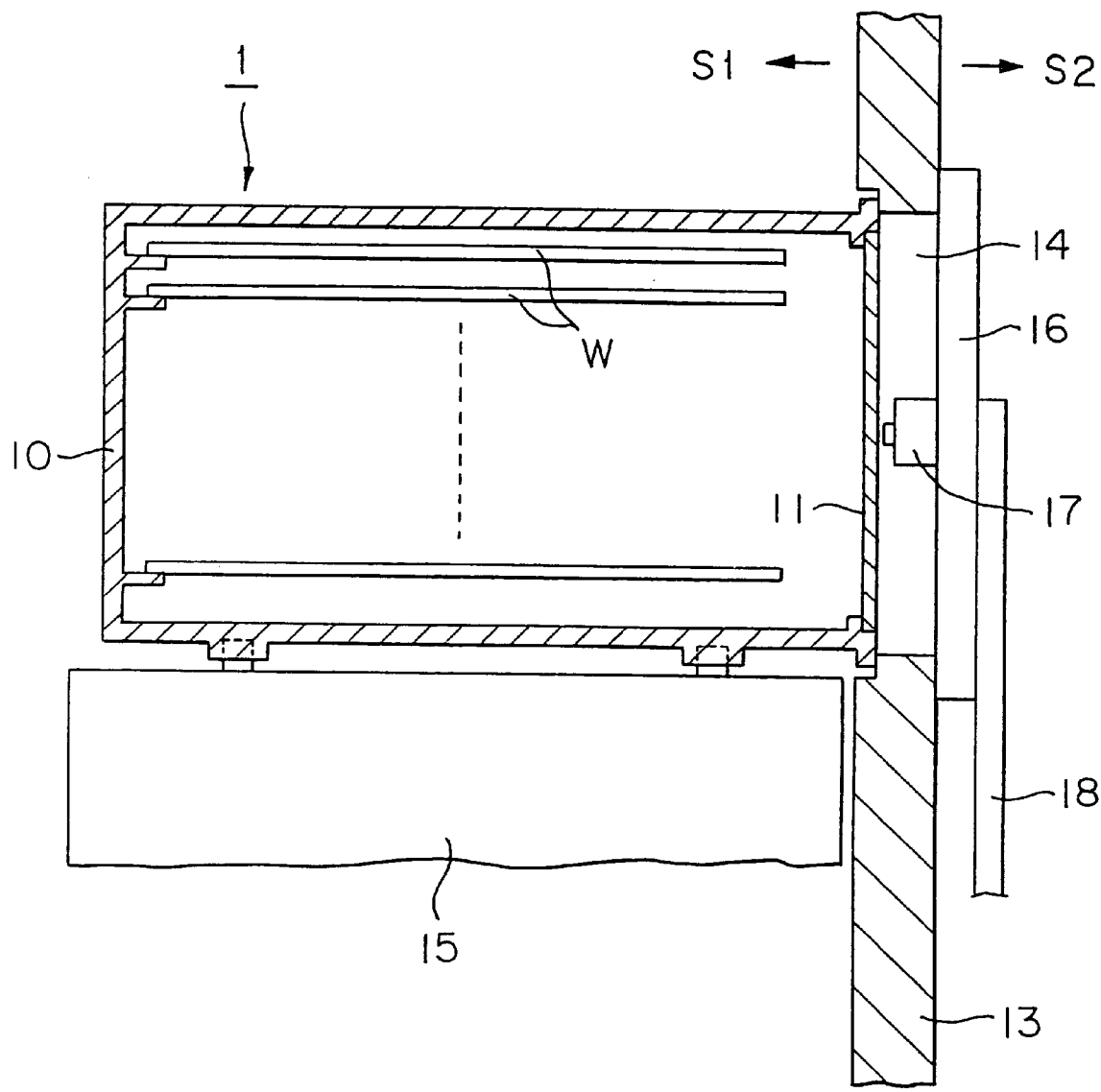
FIG. 10 is a sectional view of a prior art closed cassette.

Subsequently, as shown in FIG. 9(b), the cassette 36 is evacuated by the exhaust means 97 while nitrogen gas is supplied into the cassette 36 from the nitrogen gas source 96. Thus, the cassette 36 is purged gradually of air by nitrogen gas.

After the cassette 36 has thus been purged of air by nitrogen gas, the cassette 36 is lifted up from the purging table 93 and is carried to the next treatment station, such as a thermal treatment station. When the cassette 36 is lifted up from the purging table 93 and the gas supply pipe 94 and the gas exhaust pipe 95 are drawn out from the cassette 36, the respective incisions of the inlet valve 91a of the gas inlet port 91 and the outlet valve 92a of the gas outlet port 92 are closed to seal the cassette 36 hermetically. Thus, the hermetically sealed cassette 36 is carried to the next processing station. The cassette 36 is placed on a cassette table 6 at the next treatment station for a thermal process. Then, the gas inlet port 91 and the gas outlet port 92 serve as connecting holes.

The gas inlet port 91 and the gas outlet port 92 enable the interior of the cassette 36 to communicate with the loading zone S2 and enables the cassette 36 to be purged easily. The gas inlet port and the gas outlet port 92 may be formed in the lid 32 of the cassette.

The foregoing embodiments may be provided with a valve or valves each consisting of a plurality of elements instead of the valves 5 and 55 each provided with the incision 5a. For example, a valve normally kept in a closed state by a spring or the like and capable of being opened by pressure applied thereto by the vent pipe 51 when the cassette is placed o the stage 61 may be employed. The vent pipes 51 and 56 need not necessarily be provided with the control valve 52 and the filter 53.

According to the present invention, the lid of the cassette can easily be removed by reducing the pressure difference between the interior of the closed wafer cassette and the clean atmosphere to naught before removing the lid, and the wafer cassette can smoothly be purged of air.

What is claimed is:

1. A wafer treatment apparatus comprising:
  a wafer cassette having a cassette body provided with an opening in one side thereof for accommodating a wafer, and a lid capable of hermetically closing the opening of the cassette body;
  a cassette table for supporting the wafer cassette thereon, disposed in a working environment separated from a clean environment by a wall;
  a normally closed valve disposed at a through hole formed in the cassette body; and
  a vent pipe capable of being inserted through the valve to allow the interior of the wafer cassette to communicate with the clean atmosphere when the wafer cassette is placed on the cassette table, wherein the wall is provided with a gateway at a position corresponding to the wafer cassette as mounted on the cassette table, the gateway of the wall is closed by a door and the lid of the wafer cassette corresponds to the door of the gateway, and, wherein the through hole is formed in a bottom wall of the cassette body, the valve is placed at the through hole, and the vent pipe has one end part projecting upward from the cassette table.

2. The wafer treatment apparatus according to claim 1, wherein the vent pipe is provided with a control valve, the cassette table is provided with a detector switch for detecting the wafer cassette when the same is placed on the cassette table, and the control valve is controlled by a controller which controls the control valve on the basis of a signal provided by the detector switch.

3. The wafer treatment apparatus according to claim 1, wherein the bottom wall of the cassette body is provided with a connecting projection surrounding the valve and defining the through hole, the cassette table is provided with a table projection capable of being mated with the connecting projection, and the vent pipe has one end part held by the table projection.

4. A wafer treatment method comprising the steps of:

preparing a wafer cassette having a cassette body provided with an opening in one side thereof for accommodating a wafer, and a lid capable of hermetically closing the opening;

placing the wafer cassette on a cassette table disposed in a working atmosphere separated from a clean atmosphere by a wall having a gateway and a door closing the gateway so that the lid of the wafer cassette corresponds to the door;

connecting the interior of the wafer cassette to the clean atmosphere by inserting one end of a vent pipe connecting to the clean atmosphere, into a valve placed at a through hole which is formed in a bottom wall of the cassette body;

removing the lid from the cassette body, and taking out the wafer through the opening of the cassette body from the wafer cassette and carrying the wafer into the clean atmosphere through the gateway of the wall.

5. A wafer treatment apparatus comprising:

a wafer cassette having a cassette body provided with an opening in one side thereof for accommodating a wafer, and a lid capable of hermetically closing the opening of the cassette body;

a cassette table for supporting the wafer cassette thereon, disposed in a working environment separated from a clean environment by a wall;

a normally closed inlet valve attached to a gas inlet port formed in a bottom wall of the cassette body;

a normally closed outlet valve attached to a gas outlet port formed in a bottom wall of the cassette body;

a gas supply pipe and a gas exhaust pipe capable of being inserted through the inlet valve and the outlet valve respectively into the wafer cassette when the wafer cassette is placed on the cassette table, the gas supply pipe and the gas exhaust pipe projecting from the cassette table, and an inert gas source connected to the gas supply wherein the wall is provided with a gateway at a position corresponding to the wafer cassette as mounted on the cassette table, the gateway of the wall is closed by a door and the lid of the wafer cassette corresponds to the door of the gateway.

6. The wafer treatment apparatus according to claim 5, wherein the exhaust pipe is connected to an exhaust means.

* * * * *